United States Patent
Kristjansson (10) Patent No.: US 10,548,190 B1
(45) Date of Patent: Jan. 28, 2020

(54) NEGATIVE VOLTAGE RAIL

(71) Applicant: Microsoft Technology Licensing, LLC, Redmond, WA (US)

(72) Inventor: Stefan J. Kristjansson, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/394,856

(22) Filed: Apr. 25, 2019

(51) Int. Cl.
*H05B 33/08* (2006.01)

(52) U.S. Cl.
CPC .................. *H05B 33/0815* (2013.01)

(58) Field of Classification Search
CPC ............ H05B 33/0812; H05B 33/0815; H05B 33/0818; H05B 33/0845; H05B 33/0851; H05B 37/02; H05B 37/0272; Y02B 20/345; Y02B 20/347
See application file for complete search history.

(56) References Cited

U.S. PATENT DOCUMENTS

| | | | |
|---|---|---|---|
| 6,002,272 A * | 12/1999 | Somasekhar | H03K 19/0963 326/121 |
| 7,903,058 B1 | 3/2011 | Jacquet et al. | |
| 8,049,439 B2 | 11/2011 | Zhao et al. | |
| 8,115,414 B2 | 2/2012 | Zhao et al. | |
| 8,120,284 B2 * | 2/2012 | Chen | H05B 33/0812 315/185 R |
| 8,258,710 B2 * | 9/2012 | Alexandrovich | H05B 33/0815 315/119 |
| 8,410,717 B2 * | 4/2013 | Shteynberg | H05B 33/0812 315/185 R |
| 9,078,317 B1 * | 7/2015 | Szolusha | H05B 33/0815 |
| 9,474,113 B2 * | 10/2016 | Chou | H05B 41/2828 |
| 9,491,822 B2 | 11/2016 | Wu et al. | |
| 9,775,211 B2 | 9/2017 | Briggs | |
| 9,924,574 B1 | 3/2018 | Fernandez et al. | |
| 10,328,276 B2 * | 6/2019 | Williams | A61N 5/06 |
| 2007/0115378 A1 * | 5/2007 | Wang | A61B 1/041 348/308 |
| 2012/0262961 A1 | 10/2012 | Chien et al. | |
| 2019/0036331 A1 * | 1/2019 | Sun | H02H 9/04 |

OTHER PUBLICATIONS

"LM3463 Dynamic Headroom Controller with Thermal Control Interface and Individual Channel Dimming Control", Retrieved From: http://www.ti.com/lit/ds/Symlink/lm3463.pdf, May 2012, 43 Pages.

* cited by examiner

*Primary Examiner* — Haissa Philogene
(74) *Attorney, Agent, or Firm* — Rainer Patents, P.S.

(57) ABSTRACT

The present concepts relate to a negative rail generator that temporarily self-generates a negative voltage rail to increase the voltage difference across a light emitting diode (LED) to be greater than the positive source voltage that is available. As such, the voltage difference provides sufficient headroom to exceed the minimum forward voltage required to conduct the LED with constant current. In one example, the negative rail generator may include a capacitor, a diode clamp, and a transistor. The negative rail generator and the LED may be operated in synchronization by a common PWM signal. The negative voltage rail can be generated without adding a switched-mode power supply (SMPS) or a charge pump.

20 Claims, 5 Drawing Sheets

NEGATIVE VOLTAGE RAIL

BACKGROUND

The present concepts relate to electronic circuits in devices with limited voltage to activate a load. In particular, the present concepts relate to increasing the difference in voltage across a load to be greater than the positive supply voltage referenced to ground.

SUMMARY

The present concepts relate to a device that may include a positive voltage rail, a light emitting diode (LED), and a negative rail generator. The positive voltage rail may provide a supply voltage level. The LED may be electrically coupled to the positive voltage rail and the negative rail generator. The negative rail generator may include a capacitor, a diode clamp, and a reset transistor. The capacitor may be electrically coupled to the LED. The diode clamp may be electrically coupled to the LED and the capacitor. The reset transistor may be electrically coupled to the capacitor and ground. The negative rail generator may be configured to create a voltage difference across the LED that is greater than the supply voltage level when the reset transistor is turned on.

BRIEF DESCRIPTION OF THE DRAWINGS

The accompanying drawings illustrate implementations of the present concepts. Features of the illustrated implementations can be more readily understood by reference to the following descriptions in conjunction with the accompanying drawings. Like reference numbers in the various drawings are used where feasible to indicate like elements. In some cases, parentheticals are utilized after a reference number to distinguish like elements. Use of the reference number without the associated parenthetical is generic to the element. The accompanying drawings are not necessarily drawn to scale. In the figures, the left-most digit of a reference number identifies the figure in which the reference number first appears. The use of similar reference numbers in different instances in the description and the figures may indicate similar or identical items.

DETAILED DESCRIPTION

The present concepts relate to a circuit for temporarily generating a negative voltage rail, on an as-needed basis (i.e., on demand), to increase the voltage difference across a given load to a level that meets the minimum voltage requirement of the load which may be greater than an available system supply voltage referenced to ground. The temporary negative voltage rail may be enabled and disabled in synchronization with (i.e., tracks) an enable and disable signal that controls the load. The difference in voltage across the load may be enlarged without increasing the positive voltage at the system power rail and without adding a switched-mode power supply (SMPS) or a charge pump to create a higher positive voltage rail or a negative voltage rail. The negative voltage rail, consistent with the present concepts, may be self-generated (i.e., generated using the existing system power supply) and may operate at the same frequency as the load.

Electronic circuit designers must often ensure sufficient voltage headroom for an electronic component or circuit (i.e., a load) to maintain proper operations. That is, the difference between the positive system voltage rail and the return voltage rail, which is often ground, should be above that required to enable the load. For example, a typical red-colored LED may have a forward voltage ($V_f$) between 1.8 volts (V) and 2.2 V, and a typical white-colored LED may have a forward voltage between 2.8 V and 3.2 V. To turn on such an LED, an LED driver may need to provide sufficient voltage and/or current with enough headroom to forward bias the LED, and any additional current control or current limiting circuitry in the conduction path.

However, the driver headroom may be too small to forward bias the LED and associated circuitry when operating from an insufficient voltage source. This may occur due to a low-voltage power rail on a board (e.g., a low-power daughterboard), or if the system is powered by a 1S lithium battery system (typically ranging from 3 V to 4.2 V) or from AA or AAA 1.5V batteries, for example. Or, even a 2S battery system (typically ranging from 6 V to 8.4 V) may provide insufficient headroom if driving multiple LEDs connected in series. When the source voltage is not great enough to overcome the forward voltage drop of an LED (or LEDs) and associated circuitry in the conduction path, then the LED may not conduct and may not emit light. Furthermore, where an LED is driven by a constant current driver (e.g., a two-transistor constant current source or similar), and the source voltage is insufficient to drive enough current, either the LED may not emit light or the light emitted by the LED may not meet target output levels.

To overcome such problems, the designer must increase the operating headroom of the LED driver, and thereby increase the voltage difference across the LED (i.e., the difference in voltage levels at the anode side of the LED and the cathode side of the LED) and other circuitry in the LED path. There are two conventional options for increasing the headroom, neither of which is desirable.

The first conventional option is to generate a system power rail with a higher positive voltage, and thereby increase the voltage level at the anode side of the LED. This can be achieved, for example, by introducing a boost converter, such as an SMPS or a charge pump. A boost converter can step up the input voltage to the LED.

The second conventional option is to create a negative power rail, and thereby decrease the voltage level at the cathode side of the LED. This can be achieved conventionally, for example, by introducing a negative supply SMPS or charge pump (e.g., in an inverted configuration).

Both of the conventional options would increase the voltage difference across the LED, either by increasing the positive voltage on the anode side of the LED or decreasing the negative voltage on the cathode side of the LED. Unfortunately, the addition of such integrated circuits (ICs) would add significant costs, take up considerable board area, increase design complexity, produce high-frequency electrical noise, and/or require ramp-up time and ramp-down time, all of which are undesirable. For example, these ICs may typically include 4 or more switches, multiple capacitors, oscillators, and gate drivers, and an SMPS may include an inductor, which is often the largest single component. Some of these ICs may operate at 100 kilohertz (kHz) to 2 MHz range which may introduce unwanted noise to an otherwise clean system. Moreover, adding active ICs would require additional validation.

The present concepts can achieve the goal of increasing the headroom while avoiding the problems associated with the conventional options. The present concepts relate to a novel circuit that creates an on-demand, temporary, self-generated negative voltage power rail. In some implementations, this negative rail generator circuit may include only a few inexpensive off-the-shelf components, such as a capacitor, a diode, and a transistor. Furthermore, the negative rail generator circuit may be controlled by the same pulse width modulation (PWM) signal that controls the LED for dimming and enablement. Accordingly, a temporary negative rail may be generated on the cathode side of the LED anytime the LED is activated by the PWM signal. The negative rail generator circuit can increase the voltage difference in the LED path up to the referenced positive rail voltage minus certain voltage drops, which will be explained below. The present concepts may also include further improvements to reduce power consumption, which will be described in detail below.

The present concepts may provide a temporary negative rail as needed (e.g., when the LED is on) using only a few simple components. The negative rail generator circuit, consistent with the present concepts, may operate at low frequencies, e.g., the same operating frequency of the LED, which may be typically around 100 Hz to 200 Hz, for example, or even up to a couple of kilohertz at which some systems may drive their LEDs due to various system constraints. The present concepts may be utilized in any application where there is a desire to increase a voltage difference across a load beyond the existing voltage source level, provided that a switching signal (e.g., a clock signal) is available. For example, a speaker with an amplifier or a flexible circuit board with an LED can benefit from the present concepts.

Figure 1:
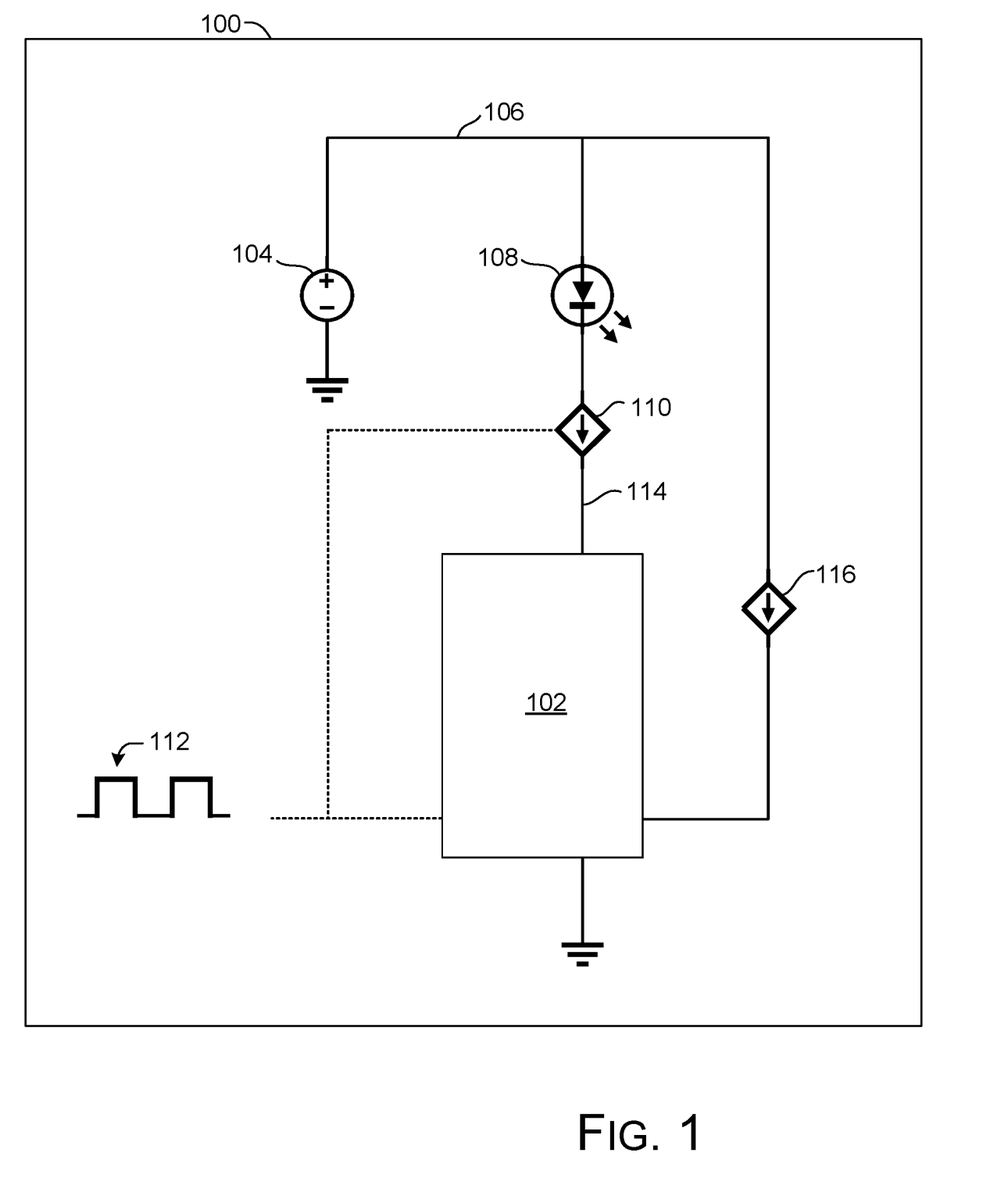
FIGS. 1-3 show circuit diagrams of a device that includes a negative rail generator, consistent with some implementations of the present concepts.

FIG. 1 shows an example circuit diagram of a device 100 that includes a negative rail generator 102, consistent with some implementations of the present concepts. The device 100 may include any electronic device, a system, or a component, such as a computer, a smart phone, a tablet, a personal digital assistant, an appliance, a wearable, an IoT, a television, a printer, a drone, a speaker, a router, etc., and any of a myriad of ever-evolving or yet-to-be-developed types of devices, systems, or components. The negative rail generator 102 may be on a printed circuit board (PCB) or in an integrated circuit (IC), inside the device 100, among other configurations. For example, the negative rail generator 102 may be implemented as discrete components for simplicity and/or flexibility. Alternatively, the negative rail generator 102 may be implemented inside an IC to save board space and/or reduce costs.

In some implementations, the device 100 may include a power supply that provides power to various parts of the device 100. Alternatively, the power supply may reside outside the device 100. The power supply may be alternating current (AC), direct current (DC), regulated, unregulated, a generator, a converter, a transformer, a battery, an IC, or any other electrical circuit or component that can provide power to one or more loads in the device 100. In the example circuit shown in FIG. 1, the power supply in the device 100 may include a voltage source 104. For example, the voltage source 104 may provide a certain positive DC supply voltage to a positive voltage rail 106.

The device 100 may include one or more loads. A load may be any electrical circuit or component that consumes electrical power. For example, the device 100 may include an LED 108. Although a single LED 108 is illustrated for simplicity, the LED 108 may include multiple LEDs in series and/or parallel. For example, the LED 108 may be a low power LED included in a computer, a mobile device, a peripheral, a display, a switch board, a control panel, etc., such as an indicator LED. Where the load includes the LED 108, the supply voltage from the voltage source 104 can be called $V_{LED}$. Also, the voltage source 104 may be included in an LED driver that controls the LED 108, or the voltage source 104 may supply power to an LED driver that controls the LED 108.

The LED 108 may include an anode side (also known as the high side or the positive side) and a cathode side (also known as the low side or the negative side). The LED 108 may glow and emit light when current flows through the LED 108 from the anode side to the cathode side. A characteristic of the LED 108 may include a forward voltage ($V_f$). If the difference between the voltage at the anode side and the voltage at the cathode side of the LED 108 (i.e., a voltage drop across the LED 108) is larger than the minimum threshold forward voltage to forward bias the LED 108, then the LED 108 may activate, i.e., current may flow through the LED 108 and the LED 108 may light up. If the difference in voltage levels across the LED 108 is not greater than the forward voltage threshold or the forward voltage for the target current level, then the LED 108 may not emit light (or it may emit light at insufficient output levels).

Typically, the forward voltage of the LED 108 may be between 1.8 V and 3.3 V (but other voltage values are possible), depending on the color of the light emitted by the LED 108 and the LED structure. For example, depending on the current, the LED 108 may emit red light and have a forward voltage of 1.8 V. Or, the LED 108 may emit blue light and have a forward voltage of 3.2 V. In some implementations, such as for low power LED applications, the LED 108 may operate from 0.1 mA to 5 mA of current.

The device 100 may include a current limiting resistor (not shown in FIG. 1) or a constant current source 110. For example, the current limiting resistor may be used where there is a stable positive supply voltage and/or where a very consistent light output is not required. Alternatively, the constant current source 110 may be used where the positive supply voltage can vary and/or where consistent light output is desired. In some implementations, the constant current source 110 may be part of an LED driver that controls the LED 108. The constant current source 110 may provide a constant current at the cathode side of the LED 108 regardless of swinging fluctuations in the supply voltage at the positive voltage rail 106. Furthermore, the constant current source 110 may be capable of providing a constant current for the LED 108 where voltage levels fluctuate at a negative rail in a dual-supply system. Since changes in the current through the LED 108 can change the luminous intensity of the LED 108, the constant current source 110 may limit changes in the current through the LED 108 and thus maintain a consistent luminous intensity from the LED 108. For example, in some implementations, the constant current source 110 may include a two-transistor circuit for driving the LED 108, or it may include a more precise current-sensing topology using comparators and/or operational amplifiers. The present concepts may be implemented using various methods of constant current control.

In some implementations, the LED 108 may be controlled by a signal. For example, an enable signal to the constant current source 110 may cause sufficient current to flow through the LED 108 and thereby activate the LED 108. Furthermore, in some implementations, the signal may be a pulse width modulation (PWM) signal 112 that turns on, when high, and turns off, when low, the LED 108 by controlling the constant current source 110. Alternative control schemes are possible, for example, where a high PWM signal turns off the LED 108 and a low PWM signal turns on the LED 108, depending on transistor arrangements. In the alternative implementation discussed above where the device 100 includes a current limiting resistor instead of the constant current source 110, the PWM signal 112 to the negative rail generator 102 may enable and disable the LED 108.

The PWM signal 112 may be generated by the LED driver. Alternatively, the PWM signal 112 may be a general-purpose input/output (GPIO) signal provided by a microcontroller unit (MCU), a system-on-chip (SoC), or any other controller with an oscillator capable of producing a PWM-type of signal. The duty cycle (i.e., the on time period $T_{on}$ divided by the total time period T) of the PWM signal 112 may control the period, average intensity of the LED 108. The frequency of the PWM signal 112 may be, for example, between 100 Hz and 1 kHz. Frequencies above about 100 Hz may be sufficiently higher than the range at which human eyes can perceive blinking or flickering of the LED 108. The designer may choose a higher frequency for the PWM signal 112, for example, if the LED 108 were being recorded by a camera that can perceive blinking and flickering at higher frequencies than the human eye, or if there are interferences on the board with other frequencies. An excessively high frequency may unnecessarily waste power due to switching losses. In some implementations, the PWM signal 112 may be provided by a PWM driver or any IC for controlling the LED 108.

The example in FIG. 1 illustrates a low-side control of the LED 108, because the high side (the anode side) of the LED 108 may be connected to (i.e., electrically coupled to, either directly or indirectly with intervening components and/or circuits) $V_{LED}$, while the low side (the cathode) of the LED 108 may be controlled (i.e., either opened or closed) to activate and deactivate the LED 108. Therefore, a variable voltage drop across the constant current source 110 may be controlled to compensate for varying $V_{LED}$ levels to keep the same setpoint current flowing through the LED 108. Alternative implementations of the present concepts using a high-side control of the LED 108 may also be possible.

FIG. 1 shows the negative rail generator 102 as a generic box for simplicity, but examples and details of the negative rail generator 102 will be explained below with reference to other figures. The negative rail generator 102 may be a component or a circuit that creates a negative voltage rail 114 on the cathode side of the LED 108 (e.g., the low side of the constant current source 110). The negative rail generator 102 may be included in the LED driver or work in conjunction with the LED driver.

Conventionally, the constant current source 110 would be connected to ground (or switched to ground). Accordingly, the positive supply voltage provided by the voltage source 104 must be greater than the forward voltage of the LED 108 plus any voltage drop across the constant current source 110. However, with the negative rail generator 102, the voltage difference across the LED 108 can be enlarged beyond the positive reference supply voltage by creating the negative voltage rail 114 on the cathode side of the LED 108. Accordingly, the negative rail generator 102 can be used in, for example, a device that includes a 1.5 V battery to drive a red-colored LED with a 1.8 $V_f$ or a device that includes a 3.0 V battery (or two 1.5 V batteries in series) to drive a white-colored LED with a 3.2 $V_f$ by self-generating the negative voltage rail 114.

In some implementations, the negative rail generator 102 may be activated by the same PWM signal 112 that activates the LED 108. Therefore, the negative rail generator 102 may create the negative voltage rail 114 temporarily (i.e., on demand) when additional headroom is desired to activate the LED 108. That is, the negative rail generator 102 may not be activated when the LED 108 is not being activated by the PWM signal 112.

Furthermore, the device 100 may include a recharge current source 116. The recharge current source 116 will be explained in detail in reference to the later figures. In some implementations, the negative rail generator 102 and/or the recharge current source 116 may be included in an LED driver that controls the LED 108.

Figure 2:
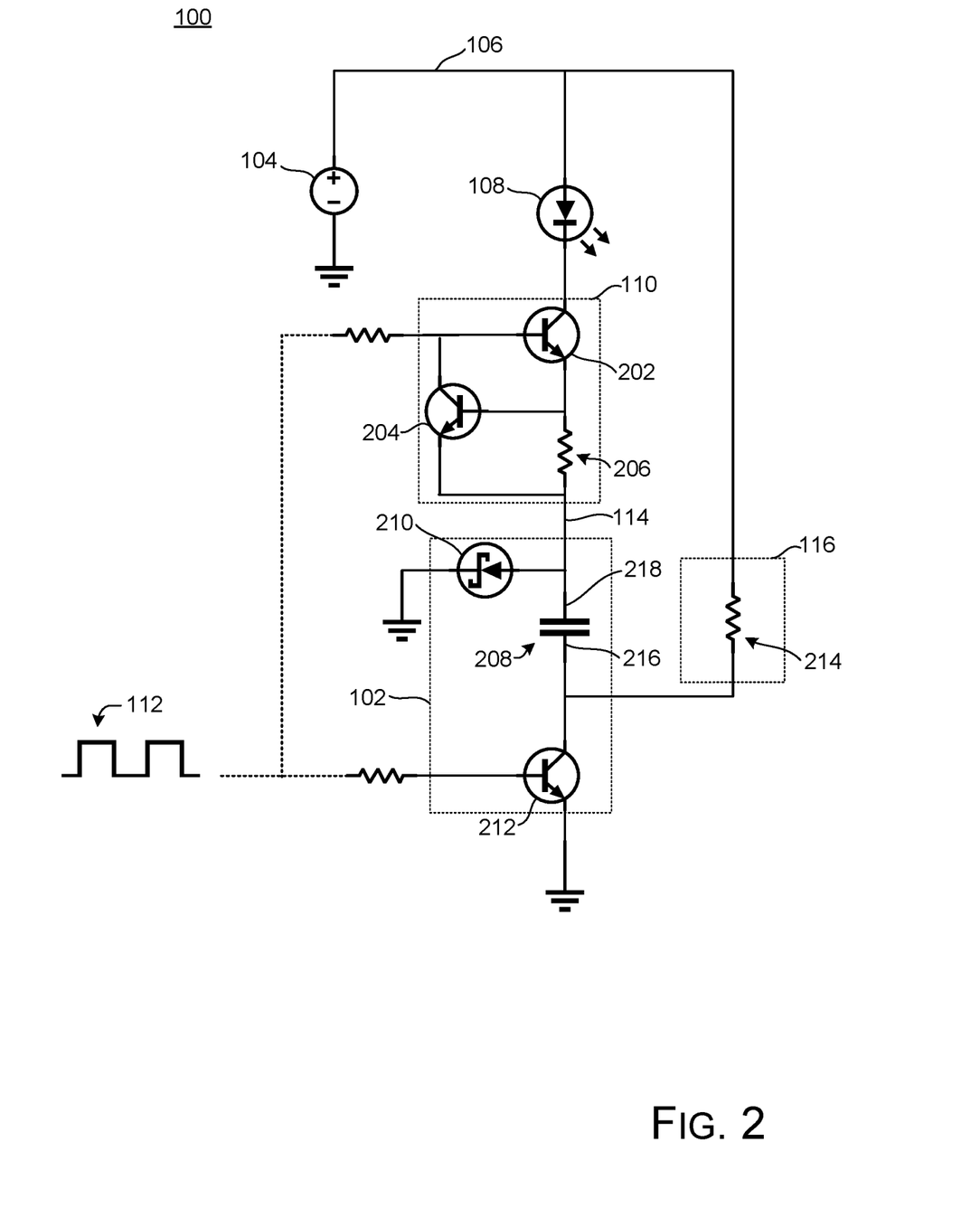

FIG. 2 shows an example circuit diagram of the device 100 that includes an example configuration of negative rail generator 102, consistent with some implementations of the present concepts. In this example, the constant current source 110 may include a limit transistor 202 (also called a pass transistor), a sense transistor 204 (also called a clamp transistor), and a sense resistor 206. For example, the limit transistor 202 and the sense transistor 204 may be two bipolar junction transistors (BJTs). Conventionally, the sense resistor 206 would be connected to ground or the return. This two-transistor circuit may be capable of maintaining a constant current through the LED 108 even as the source voltage fluctuates. The constant current can ensure a constant light output from the LED 108. In some implementations, the constant current source 110 may use metal-oxide-semiconductor field-effect transistors (MOSFETs) instead of BJTs, and could sense the current with an operational amplifier or other circuit configurations to improve accuracy.

As shown in FIG. 2, in some implementations consistent with the present concepts, the negative rail generator 102 may include a capacitor 208, a damper, and a switch. These elements may be discrete components, or they may be included in an IC. In one example implementation, the damper may include a diode clamp 210 connected to ground, and the switch may include a reset transistor 212 (also called a pulldown transistor) connected to ground. In some implementations, the damper may include a clamping transistor (not pictured in FIG. 2) instead of the diode clamp 210. The diode clamp 210 may be, for example, a Schottky diode, a conventional diode, or a transistor controlled with appropriate timing. The reset transistor 212 may be, for example, an n-type BJT transistor that is controlled by the PWM signal 112. Alternatively, the reset transistor may be a negative metal oxide semiconductor (NMOS) transistor or other types of transistor or switch. The capacitor 208 may include two pins. A pin 1 side 216 (also called the reset side) of the capacitor 208 may be connected to the reset transistor 212. A pin 2 side 218 (also called the clamp side) of the capacitor 208 may be connected to the diode clamp 210 and the sense resistor 206. Also, in FIG. 2, the recharge current source 116 may include a recharge resistor 214 in one simple example implementation. These components shown in FIG. 2 are one example implementation of the present concepts, which have been provided for explanation and illustration purposes. Other types of components and circuits may be used to achieve the effects and benefits of the present concepts.

In some implementations, the negative rail generator 102 may temporarily generate the negative voltage rail 114 on the cathode side of the LED 108 in synchronization with the LED driver by using the same PWM signal 112 that drives the LED 108. Alternatively, the negative rail generator 102 and the LED driver may be controlled by different signals but nonetheless operate sufficiently in synchronization with each other.

In some implementations, the amplitude of the PWM signal 112 may be high enough to enable the reset transistor 212 (e.g., the base-emitter voltage ($V_{BE}$) if a BJT or typically between 0.4 V and 1.2 V if a MOSFET). In one example implementation, the PWM signal 112 may have an amplitude of 1.8 V. In some implementations, the MCU that generates the PWM signal 112 may run on the same positive voltage rail 106 as the LED 108. In other implementations, the amplitude of the PWM signal 112 may be higher or lower, such as 3.3 V. Other voltage levels are also possible depending on, for example, the design of the device 100.

When the PWM signal 112 is low and therefore the LED 108 is off and the reset transistor 212 is off, the capacitor 208 may be charged through the recharge path that includes the recharge current source 116. For example, if the voltage source 104 provides 1.8 $V_{LED}$ and the diode clamp 210 has a forward voltage of 300 mV when it is on, the voltage at the pin 1 side 216 of the capacitor 208 may be 1.8 V and the voltage at the pin 2 side 218 of the capacitor 208 may be 300 mV (i.e., the $V_f$ of the diode clamp 210 above ground).

When the PWM signal 112 goes high and turns on the LED 108 using the constant current source 110, the PWM signal 112 may also turn on the reset transistor 212, which switches on the capacitor-diode network in the negative rail generator 102. That is, turning on the reset transistor 212 may form an electrical path from the positive voltage rail 106, through the LED 108, the limit transistor 202, the sense resistor 206, and into the capacitor 208. Turning on the reset transistor 212 may also pull the voltage level on the pin 1 side 216 of the capacitor 208 to ground, and the voltage level on the pin 2 side 218 of the capacitor 208 may become negative, thereby creating the negative voltage rail 114. The pin 2 side 2018 of the capacitor 208 may be called a negative voltage node.

The present concepts may utilize the fact that the capacitor 208 may not be able to immediately change the voltage across itself. For example, where the voltage source 104 provides 1.8 $V_{LED}$, when the PWM signal 112 turns on the reset transistor 212, thereby pulling the voltage level at the pin 1 side 216 of the capacitor 208 to ground (0 V), the voltage level at the pin 2 side 218 of the capacitor 208 (i.e., at the negative voltage rail 114) may be clamped at negative $V_{LED}$ (1.8 V) minus a voltage drop across the diode clamp 210 (e.g., 300 mV). Therefore, in this example, the negative voltage rail 114 may start out at about −1.5 V (1.8 V−300 mV) when the PWM signal 112 goes high. Since the capacitor 208 cannot immediately change the voltage difference across itself, when the voltage level at the pin 1 side 216 of the capacitor 208 swings −1.8 V (from 1.8 V to 0 V), the voltage level at the pin 2 side 218 of the capacitor 208 may also swing −1.8 V (from 0.3 V to −1.5 V). This preserves the voltage difference of 1.8 V across the capacitor 208. Accordingly, the negative voltage rail 114 having a negative voltage level of −1.5 V may have been generated temporarily on the pin 2 side 218 of the capacitor 208. Moreover, the diode clamp 210 may block conduction from ground (0 V) to the negative voltage node, thereby allowing it to become negative.

As time passes while the PWM signal 112 remains high, the negative voltage level of the negative voltage rail 114 may slowly become less negative, i.e., decay towards 0 V, as the LED current passes into the capacitor 208. This decay will be explained in detail below. When the PWM signal 112 goes low again, the LED 108 may turn off, the reset transistor 212 may turn off, and the capacitor 208 may recharge through the recharge path so that the voltage level at the pin 1 side 216 of the capacitor 208 approaches 1.8 V again and the voltage level at the pin 2 side 218 of the capacitor 208 is approximately 0.3 V again to begin the next cycle.

Furthermore, to prevent the voltage level at the pin 2 side 218 of the capacitor 208 from rising in the positive voltage direction when the pin 1 side 216 of the capacitor 208 is driven high again, the diode clamp 210 may be placed in order to clamp the pin 2 side 218 to ground (or at least the forward voltage of the diode clamp 210). For example, if the diode clamp 210 were a Schottky diode having a forward voltage ($V_f$) of 300 mV, then when the voltage level at the pin 1 side 216 of the capacitor 208 goes to, for example 1.8 V, then the voltage level at the pin 2 side 218 of the capacitor 208 may only rise to about 300 mV. When the PWM signal cycle repeats, the voltage level at the pin 1 side 216 of the capacitor 208 may go from about 1.8 V to about 0 V, while the voltage level at the pin 2 side 218 of the capacitor 208 may go from about 300 mV to about −1.5 V.

A perfect 1.8 V swing may not occur, because there may be some voltage drops due to the diode clamp 210, the reset transistor 212, the equivalent series resistance (ESR) of the capacitor 208, and/or the recharge resistor 214. In some implementations, the maximum negative voltage level that the negative rail generator 102 can generate may be the source voltage level provided by the voltage source 104 (or some other source for the recharge) minus the forward voltage ($V_f$) of the diode clamp 210. In the above example, the maximum negative voltage may be −1.5 V (1.8 V−300 mV). A theoretical maximum voltage difference that the negative rail generator 102 can generate may be twice the $V_{LED}$. However, the negative rail generator 102 and the device 100 may be designed and their components sized properly to achieve sufficient headroom to drive the LED 108.

Consistent with the present concepts, the capacitor 208 may be sized large enough such that the negative voltage rail 114 does not decay too much during the time the LED 108 is on ($T_{on}$). If the voltage level of the negative voltage rail 114 is not negative enough to maintain the required bias between the pin 2 side 218 of the capacitor 208 and the positive voltage rail 106, the LED 108 may no longer be forward biased and therefore turn off or its current may decrease below the target level and therefore dim.

For example, the following equations may reflect the above-described decay effect:

$$I = C \times dv/dt \qquad \text{Equation 1}$$

$$T_{on} = D/F_s \qquad \text{Equation 2}$$

where I is the LED current plus the emitter current of the sense transistor 204 (which can be significant in a BJT transistor circuit), C is the capacitance of the capacitor 208, dv/dt is the change in voltage over time, and $T_{on}$ is the on time period of one cycle, D is the duty cycle, and $F_s$ is the frequency of the PWM signal 112, respectively. In one example implementation, the current I may be about 1.2 mA (1.0 mA LED current plus 0.2 mA emitter current of the sense transistor 204).

By combining Equation 1 and Equation 2 above, the following equation may be derived.

$$dv = \frac{I \times D}{F_S \times C} \quad \text{Equation 3}$$

Equation 3 for dv may represent the change in the voltage (i.e., the degree of decay) across the capacitor 208 for a given constant current driven through the LED 108 when it is on. This change in voltage level, starting from about −1.5 V in the above example and heading towards ground (0 V), should not be so great as to eliminate the headroom required to maintain the forward biased state of the LED 108. As Equation 3 shows, the negative voltage rail 114 may become less negative linearly with time. And therefore, the capacitor 208 should be sized large enough in consideration of the duty cycle and the frequency of the PWM signal 112, such that the capacitor 208 does not reduce the negative voltage of the negative voltage rail 114 so much that the LED 108 cannot be kept biased during the on time period. Even as the negative voltage rail 114 decays, the constant current source 110 may be capable of maintaining a constant current through the LED 108

Moreover, the frequency and the duty cycle of the PWM signal 112 may impact the selection of the capacitor 208 and the peak recharge current source requirements. That is, certain combinations of frequencies and duty cycles of the PWM signal 112 may be required to keep the LED 108 on. For example, the LED 108 may be driven by a 100 Hz to 200 Hz PWM signal 112 for dimmer/brightness control, and the LED 108 may reach peak currents of 1 mA to 5 mA. With these example PWM signal frequencies and LED current loads, the capacitor 208 may be around 10 microfarads (μF) to 20 μF for duty cycles up to around 90%.

Furthermore, another consideration includes the peak current capability of the recharge current source 116 for the capacitor 208. In one implementation (shown in FIG. 2), the recharge current source 116 may include the recharge resistor 214. The recharge resistor 214 may have a low enough resistance to quickly recharge the capacitor 208 in the off time periods ($T_{off}$) when the PWM signal 112 is low and the LED 108 is off. That time period $T_{off}$ may be $T_{period} \times (1-D)$, where $T_{period}$ is the total time of one cycle and D is the duty cycle. When the PWM signal 112 is high during the on time period, the recharge resistor 214 may conduct to ground.

Consistent with the present concepts, the negative rail generator 102 may require that the LED 108 be controlled by the PWM signal 112, rather than a constantly on signal (such as a steady enable signal), in order to cycle the charging and discharging of the capacitor 208 in synchronization with the activation and deactivation of the LED 108. In other words, the PWM signal 112 may not have a 100% duty cycle as there would be no time to recharge the capacitor 208. The off time period (i.e., when the PWM signal 112 is low) may be required to reset the negative rail generator 102 and to recharge the capacitor 208 for the next cycle. Therefore, a very high duty cycle (e.g., greater than 80%) may not be feasible, depending on several factors. Because the capacitor 208 would have to replace (recharge) in a much shorter amount of time ($T_{off}$) the same amount of charge that it discharged during the period the PWM signal 112 is high ($T_{on}$), the capacitor 208 would receive a recharge pulse with a very high peak current compared to the average LED current. For example, if the frequency is very high and/or the duty cycle is very high (i.e., a low amount of off time periods), the recharge of the capacitor 208 may be insufficient and the negative rail generator 102 may fail to function properly.

The limit on the amount of off time required (i.e., how high the duty cycle can be) may be dependent on the recharge current source capabilities and acceptable losses of current. That is, the higher the duty cycle, the higher the peak recharge current requirement. For example, using a high duty cycle, if the peak current through the LED 108 is around 1 mA, the recharge current for the capacitor 208 may be around 10 mA or higher. The charge in and out of the capacitor 208 should be rebalanced through the ongoing cycles of the PWM signal 112. That is, the capacitor 208 may sufficiently recharge during the off time periods (when the PWM signal 112 is low) to replace the discharge during the on time periods (when the PWM signal 112 is high). Accordingly, the recharge current source 116 may supply sufficient charge quickly enough to replace the charge in the capacitor 208 in the off time given the duty cycle of the PWM signal 112. The recharge current level may increase as the voltage swing on the capacitor 208 increases. Additionally, the recharge current level may be limited by the recharge resistor 214 (i.e., the impedance of the recharge current source 116).

By utilizing the same PWM signal 112 that activates the LED 108, the negative voltage rail 114 may be temporarily generated only when needed (i.e., when the LED 108 is activated). The present concepts may generate the negative voltage rail 114 using only a minimal number of simple, small, inexpensive, off-the-shelf, readily available components to increase the voltage difference across the LED 108 by up to nearly twice the source voltage level. The present concepts can increase the LED driver headroom without adding any additional high frequency noise to the device 100, such as an SMPS operating at 100 kHz to 2 MHz or a 4-switch charge pump operating at 10 kHz to 200 kHz would. The negative rail generator 102, consistent with the present concepts, may operate at low frequencies, e.g., the same frequency as the LED 108, which may be around 100 Hz to 200 Hz, for example.

Accordingly, the present concepts may utilize the capacitor 208, the diode clamp 210, and the reset transistor 212—placed where ground (or the return of the constant current source 110) would normally be—to self-generate a temporary, on-demand negative voltage at the negative voltage rail 114 whenever the PWM signal 112 drives the LED 108. This increases the bias across the LED path and drives the LED 108, even where the voltage level at the positive voltage rail 106 referenced to ground would normally be insufficient to forward bias the LED 108.

In one example implementation, the device 100 may include the voltage source 104 that provides 1.8 V of source voltage, the LED 108 that requires 2.0 V of forward voltage to turn on, the sense transistor 204 having 600 mV of base-emitter voltage ($V_{BE}$), and the limit transistor 202 having 50 mV of collector-emitter voltage ($V_{CE}$). The PWM signal 112 may be a 1.8 V GPIO signal from an MCU that controls the LED 108 and also provides a "clock" signal to create the negative voltage rail 114. The 1.8 V GPIO signal may be generated from the 1.8 V voltage source 104. Conventionally, a voltage source of at least 2.65 V (2.0 V+600 mV+50 mV) would be needed to drive the constant current source 110 at the target current and thus activate the LED 108. However, with the present concepts using the negative rail generator 102, the LED 108 having a 2.0 $V_f$ can be forward biased using the voltage source 104 that provides only 1.8 V by temporarily creating the negative voltage rail 114 that increases the voltage difference across the LED path above 2.65 V. Therefore, where the device 100 runs on a battery system, the present concepts may extend the runtime of the device 100 since the battery system may be more depleted and still forward bias the LED 108 compared to conventional devices.

There may be a voltage drop across the reset transistor 212. When using a BJT as the reset transistor 212, the voltage drop may be the collector-emitter voltage ($V_{CE}$), which may be relative to the current. Accordingly, the voltage drop may be high (e.g., around 100 mV to 200 mV) since, at a high duty cycle, the recharge current peak may be much higher (e.g., more than 10 times higher) than the average LED current. So, in this example, the maximum negative voltage of the negative rail generator 102 may be about −1.3 V (1.8 V−300 mV−200 mV), assuming a high duty cycle and a high efficiency reset method (explained below in reference to FIG. 3). The voltage drop across the reset transistor 212 may be reduced by using a MOSFET instead, such that the drain-source on resistance ($R_{DS(on)}$) multiplied by the current could be a very low voltage drop.

With −1.3 V on the negative voltage rail 114 (the cathode side) and 1.8 V on the positive voltage rail 106 (the anode side), the bias for the LED path may be as high as, for example, 3.1 V (1.8 V+1.3 V) instead of only 1.8 V without the negative voltage rail 114. Accordingly, in this example, the capacitor 208 may discharge and the negative voltage rail 114 may decay as much as 450 mV (3.1 V−2.65 V) before the required headroom is lost and the current through the LED 108 drops below the setpoint (e.g., 1.0 mA) of the constant current source 110.

Equation 3 may be rearranged to solve for any of the other variables. For example, the designer may want to solve for the minimum C in Equation 3 to select the size of the capacitor 208.

$$C = \frac{I \times D}{F_S \times dv} \qquad \text{Equation 4}$$

The frequency $F_s$ of the PWM signal 112 may typically range from 100 Hz to 1 kHz. The duty cycle D of the PWM signal 112 may range between 0% and 100%, exclusive of 100%. The capacitance C may typically range from 1 μF to 20 μF, which are commonly available as 0201 or 0402 package sized multi-layer ceramic capacitors (MLCCs). For example, the current I may be 1.2 mA (1.0 mA of the LED current plus 0.2 mA of the emitter current from the sense transistor 204), the duty cycle D may be 90%, the frequency $F_s$ may be 200 Hz, and the change in voltage dv may be 450 mV. In this example, the capacitance C may be calculated as 12 μF using Equation 4. Therefore, the capacitor 208 required to support this example device 100 may be at least 12 μF, but with derating, a capacitor with an even larger capacitance may be recommended.

Equation 4 illustrates that a capacitor with less capacitance may be used if the current I is reduced, the duty cycle D is reduced, the frequency $F_s$ is increased, and/or the acceptable change in voltage dv is increased. On the other hand, slower frequencies and higher duty cycles may require larger capacitors. For example, if the designer wishes to increase the duty cycle, perhaps to brighten the light output intensity of the LED 108, then the size of the capacitor 208 may be increased, e.g., from 10 μF to 20 μF. But this change may increase power loss and increase the root mean square (RMS) current of the capacitor 208. Sizing the capacitor 208 appropriately may be important to keeping power losses, costs, and peak current levels balanced.

Using a larger capacitor may reduce the peak currents, since the peak voltage swing will be reduced. However, the cost, size, and/or availability of larger capacitors may limit the designer to select a practical capacitance for the capacitor 208. For example, if the voltage swing is 500 mV and the capacitance is 10 μF, then the amount of charge that needs to be replaced may be 5 microcoulombs (μC) (500 mV×10 μF). Furthermore, following this example, if the frequency is 200 Hz (i.e., $T_{period}$=5 ms) and the duty cycle is 98%, then the average current replaced during the off time period may be 50 mA (5 μC/{(1−98%)×5 ms}). This value is very high—50 times the LED current of 1 mA. Even if the recharge current source 116 can supply such a high recharge current, power losses may be significant, as the duty cycle increases and the off time period shrinks. Power losses through the recharge path may increase dramatically, because the peak current will increase and power losses ($P=I^2 \times R$) will increase at the square of the current. If the recharge current source 116 cannot supply the required recharge current within the recharge time window, the negative rail generator 102 may fail after a number of cycles.

Figure 3:
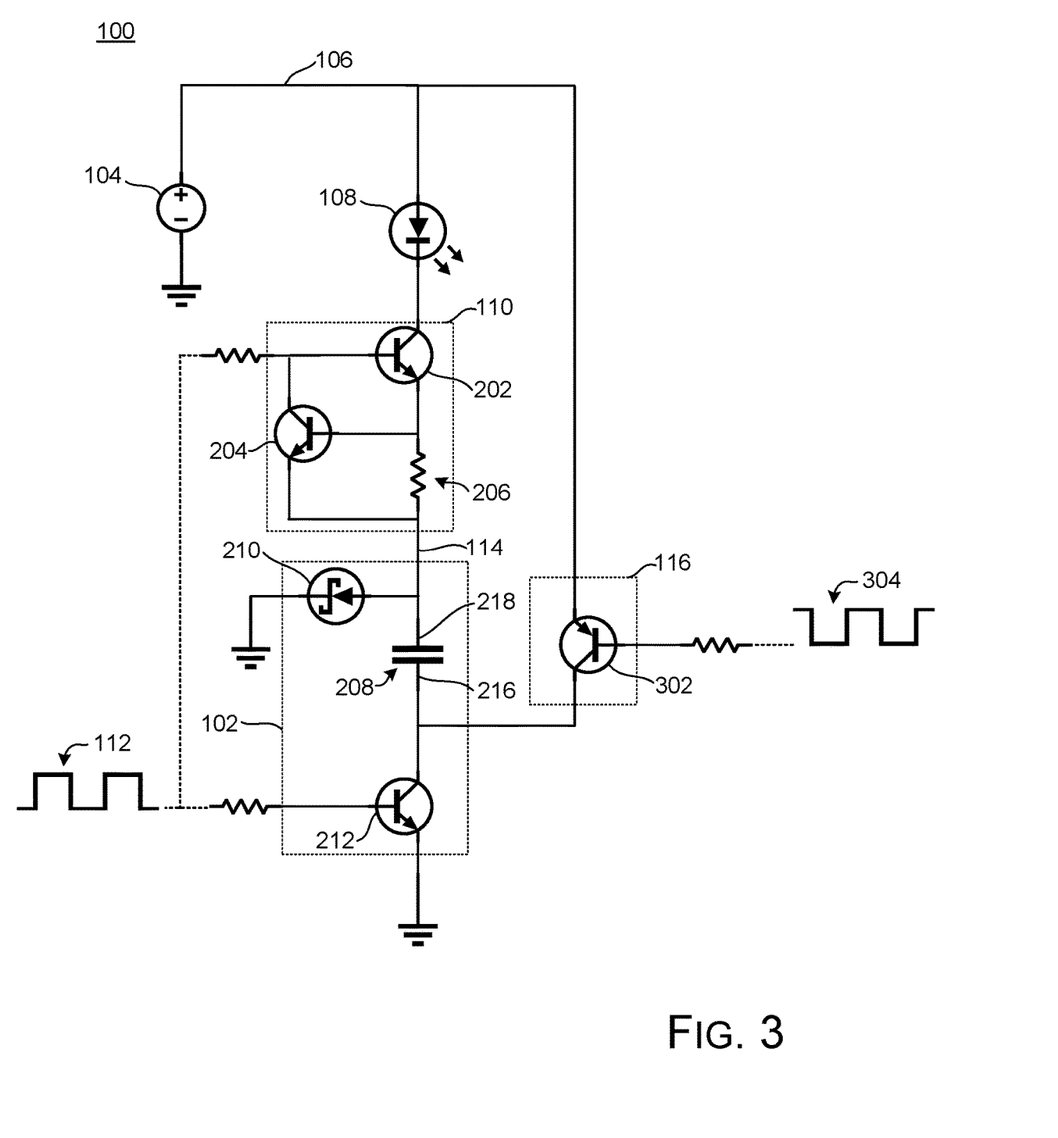

FIG. 3 shows an example circuit diagram of the device 100 that includes an example configuration of the negative rail generator 102, consistent with some implementations of the present concepts. In this alternative example configuration, the recharge current source 116 may include a recharge transistor 302.

As explained above in reference to FIG. 2, the recharge resistor 214 (shown in FIG. 2) should have low enough resistance to quickly recharge the capacitor 208 in the off time periods when the PWM signal 112 is low. However, when the PWM signal 112 is high, the low resistance of the recharge resistor 214 may allow significant power loss from the positive voltage rail 106 to ground through the recharge path. This power loss may be prevented by switching the recharge path open during the off time periods when the PWM signal 112 is high. This may be implemented using one or more transistors (e.g., BJTs or MOSFETs) that are controlled by either the same PWM signal 112 or an inverted version of the PWM signal 112.

In one example configuration, the recharge transistor 302 may be a PNP-type BJT (shown in FIG. 3) controlled by the same PWM signal 112 that drives the LED 108. In an alternative example configuration, the recharge transistor 302 may be an NPN-type BJT controlled by an inverse PWM signal 304 (shown in FIG. 3) that may be generated by inverting the PWM signal 112 that drives the LED 108 using an inverter circuit (not shown in FIG. 3). The PWM signal 112 that controls the PNP-type transistor or the inverse PWM signal 304 that controls the NPN-type transistor may be provided by an MCU (e.g., the same MCU that provides the PWM signal 112 for the LED 108).

With either configuration, when the reset transistor 212 is on and the LED 108 is emitting light, the recharge transistor 302 may not conduct, thereby disconnecting the recharge path and preventing power loss to ground. Conversely, when the reset transistor 212 is off and the LED 108 is off, the recharge transistor 302 may conduct in order to recharge the capacitor 208. The PWM signal 112 (or the inverse PWM signal 304) may have a high enough amplitude to turn on and off the recharge transistor 302. In some implementations, a level shifter transistor may be added to increase the amplitude of the PWM signal 112 (or the inverse PWM signal 304) that controls the recharge transistor 302.

The recharge transistor 302, consistent with the present concepts, may significantly reduce power consumption by the device 100 when the LED 108 is on. And, the recharge transistor 302 may be able to recharge the capacitor 208 when the LED 108 is off so that, at the next cycle, the negative voltage rail 114 can be generated to increase the headroom when the LED 108 is turned on. Using the recharge transistor 302 shown in FIG. 3 can drastically improve the power efficiency of the device 100 compared to using the recharge resistor 214 shown in FIG. 2.

FIGS. 4-9 show graphs of example electrical characteristics of the device 100 that includes the negative rail generator 102, consistent with some implementations of the present concepts. The values of voltage, current, and time on the axes of the graphs are provided merely as examples. Other values are possible, consistent with the present concepts. Moreover, the curves in the graphs have been simplified (i.e., they are simulated waveforms) for the purposes of illustration and explanation of the present concepts. The curves may not exactly represent real-life measurement curves that may be observed with actual implementations of the present concepts. Many variations of these curves, especially with different implementations of the present concepts, may be possible. For example, FIG. 4-9 have a common x-axis, indicating time. Although the example curves have been drawn in perfect synchronization with one another with respect to time for illustration and for simplicity, real-life implementations of the present concepts may exhibit time delays in the curves with respect to one another (e.g., ramp-up periods).

Figure 4:
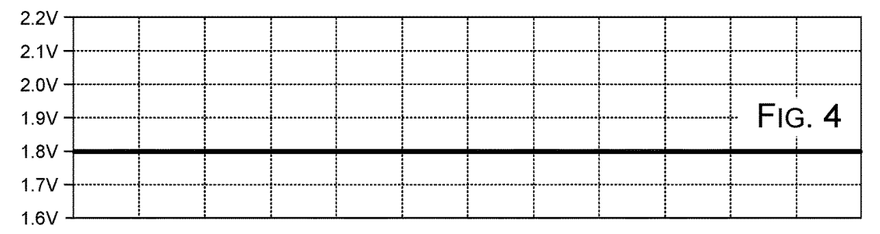
FIGS. 4-9 show graphs of electrical characteristics of a device that includes a negative rail generator, consistent with some implementations of the present concepts.
Figure 5:
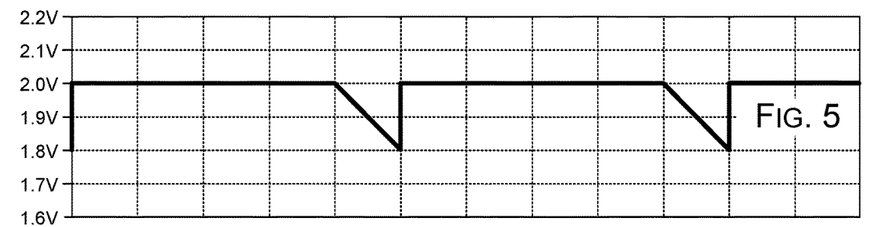
Figure 6:
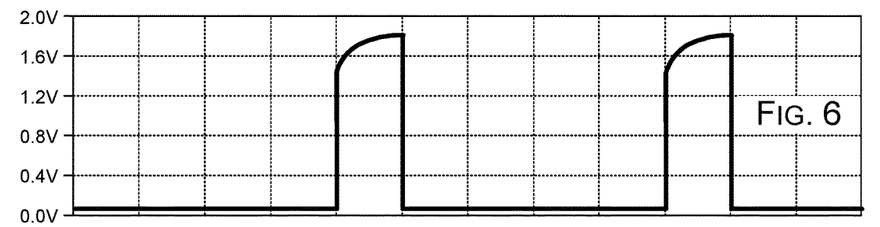
Figure 7:
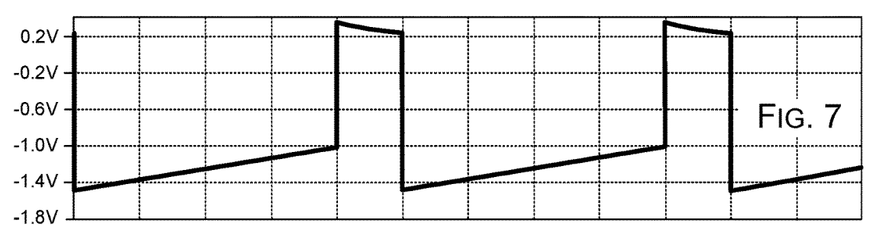
Figure 8:
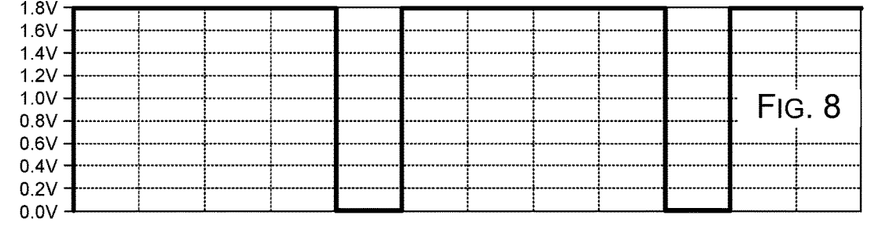
Figure 9:
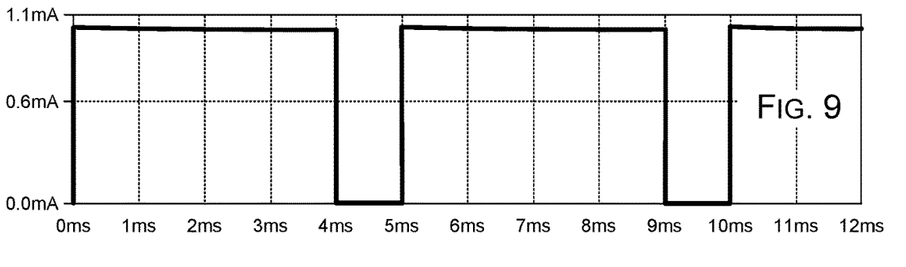

FIG. 4 shows a graph of example voltage levels that may be supplied by the voltage source 104 at the positive voltage rail 106 (i.e., at the anode side of the LED 108). FIG. 5 shows a graph of example voltage difference levels across the LED 108 (i.e., the voltage drop across the LED 108). FIG. 6 shows a graph of example voltage levels at the collector side of the reset transistor 212 (i.e., the pin 1 side 216 of the capacitor 208). FIG. 7 shows a graph of example voltage levels at the negative voltage rail 114. FIG. 8 shows a graph of example voltage levels of the PWM signal 112. FIG. 9 shows a graph of the example current levels flowing through the LED 108.

FIG. 4-9 may relate to an example of the device 100 that may include the voltage source 104 supplying a constant 1.8 V to the positive voltage rail 106, as shown in FIG. 4, the constant current source 110 providing 1 mA of constant current, the capacitor 208 having 10 µF capacitance, and the LED 108 having a forward voltage of 2.0 V (e.g., a red-colored LED). Conventionally, the voltage source 104 may not be able to forward bias the LED 108 to turn it on without replacing the voltage source 104 with a higher voltage supply or adding a negative voltage source from an SMPS. But, consistent with the present concepts, the device 100 may use the PWM signal 112, having 1.8 V amplitude, 200 Hz frequency, and 80% duty cycle, as shown in FIG. 8, to generate the negative voltage rail 114 and sufficient headroom to forward bias the LED 108 to conduct, for example, at a constant 1 mA per the current setting target.

In this example, the PWM signal 112 shown in FIG. 8 cycles every 5 ms, it is high at 1.8 V for 4 ms, and it is low at 0 V for 1 ms. When the PWM signal 112 goes high from 0 V to 1.8 V at 0 ms (or at 5 ms, 10 ms, etc.), the reset transistor 212 may conduct, thereby pulling the voltage level at its collector side to ground (0 V), as shown in FIG. 6. This may cause the negative voltage rail 114 to charge to about −1.5 V, as shown in FIG. 7. Accordingly, about 3.3 V (1.8 V+1.5 V) of voltage difference is created across the LED path, which is more than sufficient to light up the LED 108 since 3.3 V is greater than the 2.0 V drop across the LED 108 plus 600 mV drop for the sense resistor 206 plus a small voltage drop across the reset transistor 212.

As time passes from 0 ms to 4 ms while the PWM signal 112 remains high (i.e., the on time period), the capacitor 208 may discharge, and the voltage level at the negative voltage rail 114 may decay (i.e., becomes less negative) from about −1.5 V at 0 ms to about −1.0 V at 4 ms, as shown in FIG. 7. Even at 4 ms, the voltage difference is about 2.8 V (1.8 V+1.0 V), which is still large enough to keep the LED 108 lit, since 2.8 V is greater than the sum of the voltage drops across the LED 108, the sense resistor 206, and the reset transistor 212. Therefore, in this example, the negative voltage rail 114 did not decay so much that the LED 108 did not remain lit at the target current setting throughout the on time period.

At 4 ms, the PWM signal 112 may go low (i.e., fall from 1.8 V to 0 V), and the PWM signal 112 remains low for 1 ms from 4 ms until 5 ms, as shown in FIG. 8. During this off time period, the constant current source 110 may stop driving the LED 108, such that the voltage drop across the LED 108 is less than 2.0 V, as shown in FIG. 5, thereby turning off the LED 108. Furthermore, the reset transistor 212 may turn off, and the recharge transistor 302 turn on, thereby raising the voltage levels at the collector side of the reset transistor 212, as shown in FIG. 6. This may cause the negative voltage rail 114 to practically disappear (i.e., the voltage is no longer negative), as shown in FIG. 7, while the capacitor 208 charges for the next cycle. And at 5 ms, when the PWM signal 112 goes high again, i.e., the beginning of the next cycle, the described process may start again.

Figure 10:
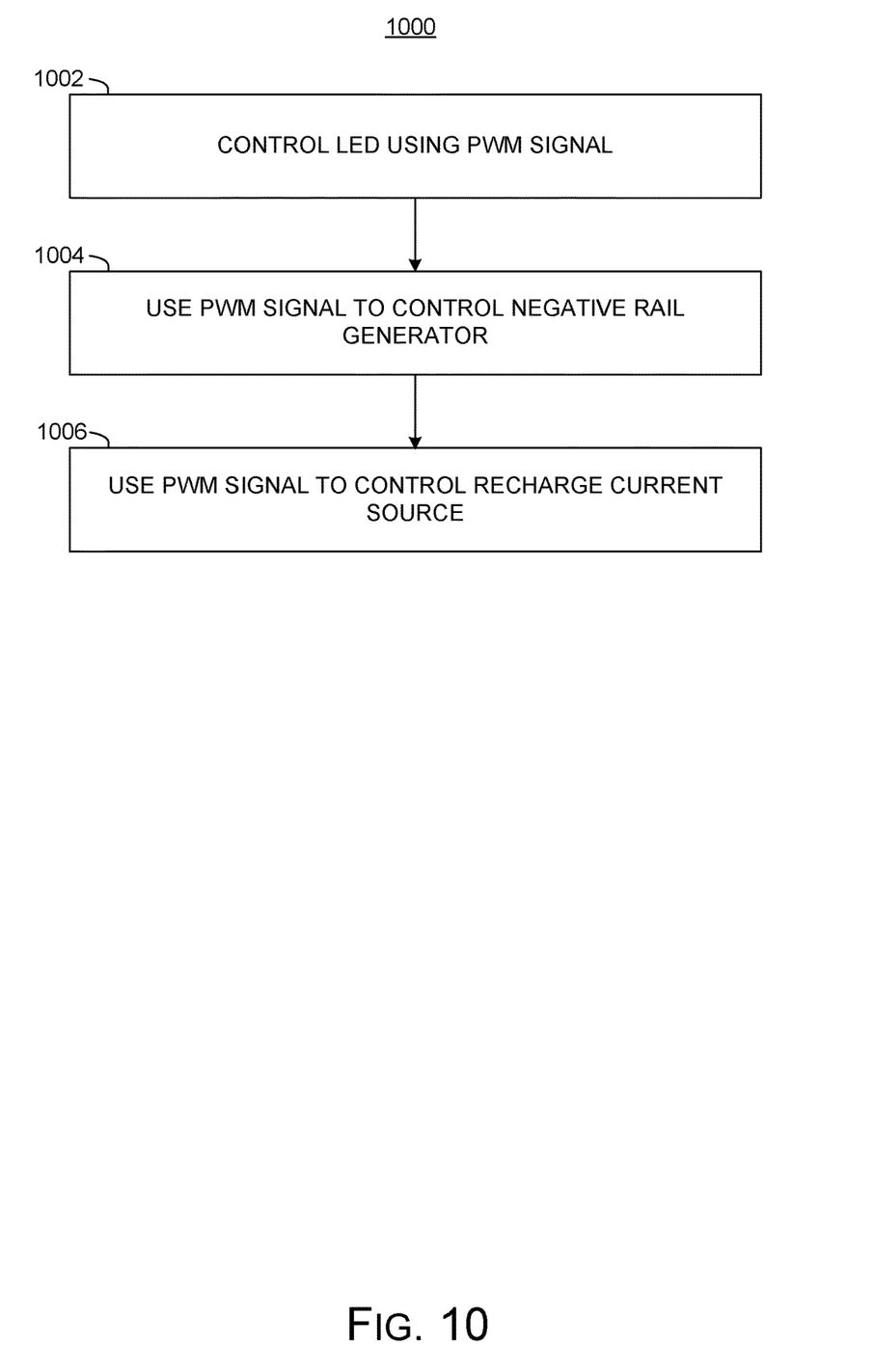
FIG. 10 shows a flowchart illustrating a negative rail generating method, consistent with some implementations of the present concepts.

FIG. 10 shows a flowchart illustrating a negative rail generating method 1000 that can implement some of the present concepts. The negative rail generating method 1000 may be performed, for example, using any one of the various implementations described above or other implementations that are consistent with the present concepts but not explicitly described above.

In act 1002, an LED may be controlled using a PWM signal. For example, in some implementations, the PWM signal may activate and deactivate an LED driver or switch having a constant current source on the cathode side (the low side) of the LED. The anode side (the high side) of the LED may be connected to a positive voltage rail having a positive voltage supplied by a power source.

In act 1004, the same PWM signal that controls the LED may also turn on and off a negative voltage generator that may be positioned between the constant current source and ground. Accordingly, by leveraging the same PWM signal, the LED and the negative voltage generator may be activated and deactivated in synchronization with each other (i.e., both are on or both are off at the same time periods). When the negative voltage generator is activated, it may temporarily create a negative voltage rail on the low side of the LED, thereby increasing the difference in voltage across the LED and circuitry in the conduction path to be greater than the reference positive voltage to ground provided by the power supply.

In some implementations, the negative voltage generator may include a reset transistor that is activated and deactivated by the PWM signal. The reset transistor may be a n-type BJT whose emitter is connected to ground and whose collector is connected to a capacitor or an NMOS transistor in the same functional configuration. The other side of the capacitor may be connected to the constant current source and also to a diode clamp that is connected to ground.

When the PWM signal goes high, the capacitor may swing the voltage at the cathode side of the LED to a negative voltage level to temporarily generate the negative voltage rail, thereby creating sufficient headroom to turn on the LED. As the capacitor discharges, the negative voltage rail may decay. When the PWM signal goes low, the negative voltage rail essentially disappears and the LED conduction path is opened, and the capacitor may recharge via a recharge current source. In one implementation, the recharge current source may include a resistor in a recharge path from the positive voltage rail to the low side of the capacitor.

Alternatively, the recharge current source may include a recharge transistor or switch that turns off while the LED is on to prevent loss of power through the recharge path to ground. Using this alternative implementation, in act 1006, the same PWM signal may be used to control the recharge current source, or a level shifted or inverted version of the PWM signal may be used. That is, the PWM signal may turn on the recharge transistor (e.g., a PNP-type) to recharge the capacitor while the PWM signal turns off the LED, and the PWM signal may turn off the recharge transistor to prevent power loss while the PWM signal turns on the LED.

Various examples are described above. Although the subject matter has been described in language specific to structural features and/or methodological acts, the subject matter defined in the appended claims is not necessarily limited to the specific features or acts described above. Rather, the specific features and acts described above are presented as example forms of implementing the claims, and other features and acts that would be recognized by one skilled in the art are intended to be within the scope of the claims.

The invention claimed is:

1. A device, comprising:
    a positive voltage rail for providing a supply voltage level;
    a light emitting diode (LED) electrically coupled to the positive voltage rail; and
    a negative rail generator electrically coupled to the LED, the negative rail generator including:
        a capacitor electrically coupled to the LED;
        a diode clamp electrically coupled to the LED and the capacitor; and
        a reset transistor electrically coupled to the capacitor and ground,
    the negative rail generator being configured to create a voltage difference across the LED that is greater than the supply voltage level when the reset transistor is turned on.

2. The device of claim 1, wherein the negative rail generator is configured to create a negative voltage rail on a cathode side of the LED when the reset transistor is turned on.

3. The device of claim 1, wherein the LED has a forward voltage that is greater than the supply voltage level as reference to ground and less than the voltage difference across the LED when the reset transistor is on.

4. The device of claim 1, further comprising:
    a constant current source between the LED and the negative rail generator,
    wherein a pulse width modulation (PWM) signal to the constant current source enables and disables the LED.

5. The device of claim 4, wherein the PWM signal that enables and disables the LED also turns on and turns off the reset transistor.

6. The device of claim 1, further comprising:
    a recharge current source electrically coupled to the positive voltage rail and the capacitor.

7. The device of claim 6, wherein the recharge current source includes a resistor.

8. The device of claim 6, wherein the recharge current source includes a recharge transistor electrically coupled to the positive voltage rail and the capacitor.

9. The device of claim 8, wherein a PWM signal turns on the recharge transistor when the reset transistor is off, and the PWM signal turns off the recharge transistor when the reset transistor is on.

10. A circuit, comprising:
    a capacitor having a first pin and a second pin, the second pin of the capacitor being electrically coupled to a low side of a load, the load having a high side electrically coupled to a positive rail for supplying a positive voltage;
    a clamper having a first pin and a second pin, the first pin of the clamper being electrically coupled to ground, the second pin of the clamper being electrically coupled to the second pin of the capacitor; and,
    a switch having a first pin and a second pin, the first pin of the switch being electrically coupled to ground, the second pin of the switch being electrically coupled to the first pin of the capacitor, the switch, when closed, creating a negative rail having a negative voltage on the low side of the load.

11. The circuit of claim 10, wherein, when the switch is closed, a voltage difference across the load is greater than the positive voltage of the positive rail referenced to ground.

12. The circuit of claim 10, further comprising:
    a recharge current source electrically coupled to the positive rail and the first pin of the capacitor.

13. The circuit of claim 12, wherein the recharge current source includes a transistor electrically coupled to the positive rail and the first pin of the capacitor.

14. The circuit of claim 12, wherein the recharge current source is active when the switch is open, and the recharge current source is inactive when the switch is closed.

15. The circuit of claim 12, wherein the recharge current source is activated by a PWM signal that closes and opens the switch.

16. The circuit of claim 10, wherein the switch is closed and opened by a PWM signal that also enables and disables the load.

17. The circuit of claim 10, wherein the load includes an LED.

18. The circuit of claim 10, wherein the clamper includes a diode clamp.

19. A method, comprising:
    controlling an LED using a PWM signal, an anode side of the LED being electrically coupled to a positive rail having a positive voltage; and
    using the PWM signal to turn on and turn off a negative rail generator that is electrically coupled to ground and to a cathode side of the LED,
    the negative rail generator, when turned on by the PWM signal, creating a negative rail on the cathode side of the LED and creating a voltage difference across the LED that is greater than the positive voltage of the positive rail.

20. The method of claim 19, further comprising:
    using the PWM signal to control a recharge current source that is electrically coupled to the positive rail and the negative rail generator.

* * * * *